(12) United States Patent
Kwak et al.

(10) Patent No.: US 11,706,956 B2
(45) Date of Patent: Jul. 18, 2023

(54) DISPLAY DEVICE HAVING SIDE SURFACE CONNECTION PADS

(71) Applicant: Samsung Display Co., Ltd., Yongin-si (KR)

(72) Inventors: Jinseon Kwak, Yongin-si (KR); Gyungsoon Park, Yongin-si (KR); Heejean Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 50 days.

(21) Appl. No.: 17/007,510

(22) Filed: Aug. 31, 2020

(65) Prior Publication Data

US 2021/0305346 A1   Sep. 30, 2021

(30) Foreign Application Priority Data

Mar. 27, 2020   (KR) .......................... 10-2020-0037796

(51) Int. Cl.
*H10K 59/131*   (2023.01)
*H01L 23/00*   (2006.01)

(52) U.S. Cl.
CPC .......... *H10K 59/131* (2023.02); *H01L 24/05* (2013.01); *H01L 24/06* (2013.01); *H01L 24/32* (2013.01); *H01L 2224/05567* (2013.01); *H01L 2224/06102* (2013.01); *H01L 2224/32225* (2013.01)

(58) Field of Classification Search
CPC ..... H01L 27/3276; H01L 24/05; H01L 24/06; H01L 24/32; H01L 2224/05567; H01L 2224/06102; H01L 2224/32225; G02F 1/136227; H10K 59/131; H10K 59/1213; H10K 59/123; H10K 59/124; H10K 59/126; H10K 59/1315; H10K 59/122
USPC ........................................................ 257/773
See application file for complete search history.

(56) References Cited

U.S. PATENT DOCUMENTS

| 9,632,381 B2 | 4/2017 | Kang et al. |
| 10,203,573 B2 | 2/2019 | Park et al. |
| 2013/0168704 A1* | 7/2013 | Huang ................ H01L 27/1288 257/E33.062 |

(Continued)

FOREIGN PATENT DOCUMENTS

| KR | 10-1281901 | 7/2013 |
| KR | 10-2015-0011731 | 2/2015 |

(Continued)

*Primary Examiner* — Nduka E Ojeh
*Assistant Examiner* — Laura M Dykes
(74) *Attorney, Agent, or Firm* — Kile Park Reed & Houtteman PLLC

(57) ABSTRACT

A display device with a reduced area of dead spaces and a low defect occurrence rate includes a substrate including a display area and a peripheral area; and a first insulating layer disposed over the peripheral area and including a first side surface portion, a second side surface portion, and at least one recess portion. The first side surface portion includes a side surface aligned with a side surface of the substrate, and the second side surface portion includes a side surface aligned with the side surface of the substrate and is spaced apart from the first side surface portion. A first pad is disposed on the first insulating layer, extends to an edge of the substrate, fills the at least one recess portion, and includes a front end surface aligned with the side surface of the substrate.

28 Claims, 14 Drawing Sheets

(56) References Cited

U.S. PATENT DOCUMENTS

| | | | | |
|---|---|---|---|---|
| 2015/0144911 A1* | 5/2015 | Pang | ............... | H01L 51/5284 |
| | | | | 257/40 |
| 2016/0100483 A1* | 4/2016 | Hwang | ............ | H01L 21/76816 |
| | | | | 313/505 |
| 2017/0082900 A1* | 3/2017 | Kong | ............... | G02F 1/13458 |

FOREIGN PATENT DOCUMENTS

| KR | 10-2017-0034188 | 3/2017 |
|---|---|---|
| KR | 10-2017-0125187 | 11/2017 |
| KR | 10-2060652 | 12/2019 |

* cited by examiner

500 # DISPLAY DEVICE HAVING SIDE SURFACE CONNECTION PADS

CROSS-REFERENCE TO RELATED APPLICATION

This application claims the benefit of Korean Patent Application No. 10-2020-0037796 under 35 U.S.C. § 119, filed in the Korean Intellectual Property Office on Mar. 27, 2020, the disclosure of which is incorporated herein in its entirety by reference.

BACKGROUND

1. Field

The present disclosure relates to a display device, and more specifically, to a display device with a reduced area of dead spaces and a low defect occurrence rate.

2. Description of Related Art

In general, portable devices such as smartphones or laptops have a display device as an element. The display device includes a display area capable of displaying an image, and a peripheral area outside the display area and not capable of displaying an image. It may be advantageous for a display device to have a display area of a sufficient size to enhance user convenience while the overall size of the portable device is reduced by reducing the area of the peripheral area. Even for non-portable devices having a display device as an element, such as televisions, it may be advantageous to increase the size of the display area of the display device and to decrease the size of the peripheral area.

SUMMARY

Conventional display devices have a problem that the area of a peripheral area is large because the area of a substrate, to which a printed circuit board for applying an electrical signal to a display area is attached, is large.

The disclosure provides technical solutions to a number of problems, including the abovementioned problem, and provides a display device with a reduced area of dead spaces and a low defect occurrence rate. However, these objectives are merely exemplary, and the scope of the disclosure is not limited thereto.

Additional aspects of the disclosure will be set forth in part in the following description, or will be apparent in part from the description, or may be learned by practicing embodiments of the disclosure.

According to one or more embodiments, a display device may include a substrate including a display area and a peripheral area adjacent to the display area, a first insulating layer disposed over the peripheral area of the substrate and including a first side surface portion including a side surface aligned with a side surface of the substrate, a second side surface portion spaced apart from the first side surface portion and including a side surface aligned with the side surface of the substrate, and at least one recess portion between the first side surface portion and the second side surface portion, and a first pad disposed on the first insulating layer, extending to an edge of the substrate, and filling the at least one recess portion. The first pad may include a front end surface aligned with the side surface of the substrate.

The first insulating layer may comprise a plurality of through holes extending in a direction perpendicular to the substrate, and the first pad may fill the plurality of through holes.

The plurality of through holes may be arranged randomly in a plan view with respect to the substrate.

The first pad may have a shape extending along a long axis of the first pad. The plurality of through holes may be arranged in a zigzag pattern in a direction perpendicular to the long axis of the first pad.

The plurality of through holes may be arranged such that a virtual straight line, which is parallel to an upper surface of the substrate and passes through the first pad, passes through at least one of the plurality of through holes.

The plurality of through holes may be arranged such that a virtual plane, which is parallel to the side surface of the substrate, passes through at least one of the plurality of through holes.

Each of the at least one recess portion may have a slit shape extending in a direction away from the side surface of the substrate.

The first insulating layer may comprise a third side surface portion between the first side surface portion and the second side surface portion, the third side surface including a side surface aligned with the side surface of the substrate, and the at least one recess portion may comprise a first recess portion between the first side surface portion and the third side surface portion, and a second recess portion between the second side surface portion and the third side surface portion.

The first insulating layer may comprise a third side surface portion between the first side surface portion and the second side surface portion, the third side surface portion including a side surface aligned with the side surface of the substrate, and the at least one recess portion may comprise a first recess portion between the first side surface portion and the third side surface portion and having a slit shape extending in a direction away from the side surface of the substrate; and a second recess portion between the second side surface portion and the third side surface portion and having a slit shape extending in the direction away from the side surface of the substrate.

The first recess portion and the second recess portion may be parallel to each other.

The display device may comprise a second pad disposed between the substrate and the first pad, contacting the first pad, and including a front end surface aligned with the side surface of the substrate.

The first insulating layer may be disposed between the first pad and the second pad and covering side edges of the second pad connected to the front end surface of the second pad.

The display device may further comprise a third pad disposed below the second pad; and a second insulating layer disposed between the third pad and the second pad.

According to one or more embodiments, a display device may include a substrate including a display area and a peripheral area adjacent to the display area; a first insulating layer disposed over the peripheral area of the substrate and including at least one recess portion in a side surface of first the insulating layer, wherein a portion of the side surface of the first insulating layer other than another portion of the side surface where the at least one recess portion is disposed may be aligned with the side surface of the substrate; and a first pad disposed on the first insulating layer, extending to an edge of the substrate, and filling the at least one recess portion. The first pad may include a front end surface aligned with the side surface of the substrate.

The first insulating layer may include a plurality of through holes extending in a direction perpendicular to the substrate, and the first pad may fill the plurality of through holes.

The plurality of through holes may be arranged randomly in a plan view with respect to the substrate.

The first pad may have a shape extending along a long axis of the first pad, and the plurality of through holes may be arranged in a zigzag pattern in a direction perpendicular to the long axis of the first pad.

The plurality of through holes may be arranged such that a virtual straight line, which is parallel to an upper surface of the substrate and passes through the first pad, passes through at least one of the plurality of through holes.

The plurality of through holes may be arranged such that a virtual plane, which is parallel to the side surface of the substrate, passes through at least one of the plurality of through holes.

Each of the at least one recess portion may have a slit shape extending in a direction away from the side surface of the substrate.

The display device may further include a second pad disposed between the substrate and the first pad, contact the first pad, and include a front end surface aligned with the side surface of the substrate.

The first insulating layer may be disposed between the first pad and the second pad and cover side edges of the second pad connected to the front end surface of the second pad.

The display device may further include a third pad disposed below the second pad, and a second insulating layer between the third pad and the second pad.

According to one or more embodiments, a display device may include a substrate including a display area and a peripheral area adjacent to the display area, a first insulating layer disposed over the peripheral area of the substrate and including a first side surface portion including a side surface aligned with a side surface of the substrate, a second side surface portion spaced apart from the first side surface portion and including a side surface aligned with the side surface of the substrate, at least one recess portion between the first side surface portion and the second side surface portion, and a plurality of through holes extending in a direction perpendicular to the substrate, a plurality of first pads disposed on the first insulating layer and spaced apart from each other, the plurality of first pads filling the at least one recess portion and at least a part of the plurality of through holes, and a second pad disposed between the substrate and the plurality of first pads, contacting the plurality of first pads, and including a front end surface aligned with the side surface of the substrate. At least a part of the plurality of first pads may include a front end surface aligned with the side surface of the substrate.

The plurality of through holes may be arranged randomly in a plan view with respect to the substrate.

The second pad may have a shape extending along a long axis of the second pad, and the plurality of through holes may be arranged in a zigzag pattern in a direction perpendicular to the long axis of the second pad.

The plurality of through holes may be arranged such that a virtual straight line, which is parallel to an upper surface of the substrate and passes through the second pad, passes through at least one of the plurality of through holes.

The plurality of through holes may be arranged such that a virtual plane, which is parallel to the side surface of the substrate, passes through at least one of the plurality of through holes.

The first insulating layer may cover side edges of the second pad connected to the front end surface of the second pad.

The display device may comprise a third pad disposed below the second pad; and a second insulating layer disposed between the third pad and the second pad.

According to one or more embodiments, a display device may include a substrate including a display area and a peripheral area adjacent to the display area, a first insulating layer disposed over the peripheral area of the substrate and including a first side surface portion including a side surface aligned with a side surface of the substrate, a second side surface portion spaced apart from the first side surface portion and including a side surface aligned with the side surface of the substrate, a third side surface portion between the first side surface portion and the second side surface portion and including a side surface aligned with the side surface of the substrate, a first recess portion between the first side surface portion and the second side surface portion and having a slit shape extending in a direction away from the side surface of the substrate, and a second recess portion between the second side surface portion and the third side surface portion and having a slit shape extending in the direction away from the side surface of the substrate, a plurality of first pads disposed on the first insulating layer and spaced apart from each other, the plurality of first pads filling at least a part of the first recess portion and the second recess portion, and a second pad disposed between the substrate and the plurality of first pads, contacting the plurality of first pads, and including a front end surface aligned with the side surface of the substrate. At least a part of the plurality of first pads may include a front end surface aligned with the side surface of the substrate.

The first recess portion and the second recess portion may be parallel to each other.

The first insulating layer may cover side edges of the second pad connected to the front end surface of the second pad.

The display device may further include a third pad disposed below the second pad, and a second insulating layer between the third pad and the second pad.

Aspects, features, and advantages other than those described above will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
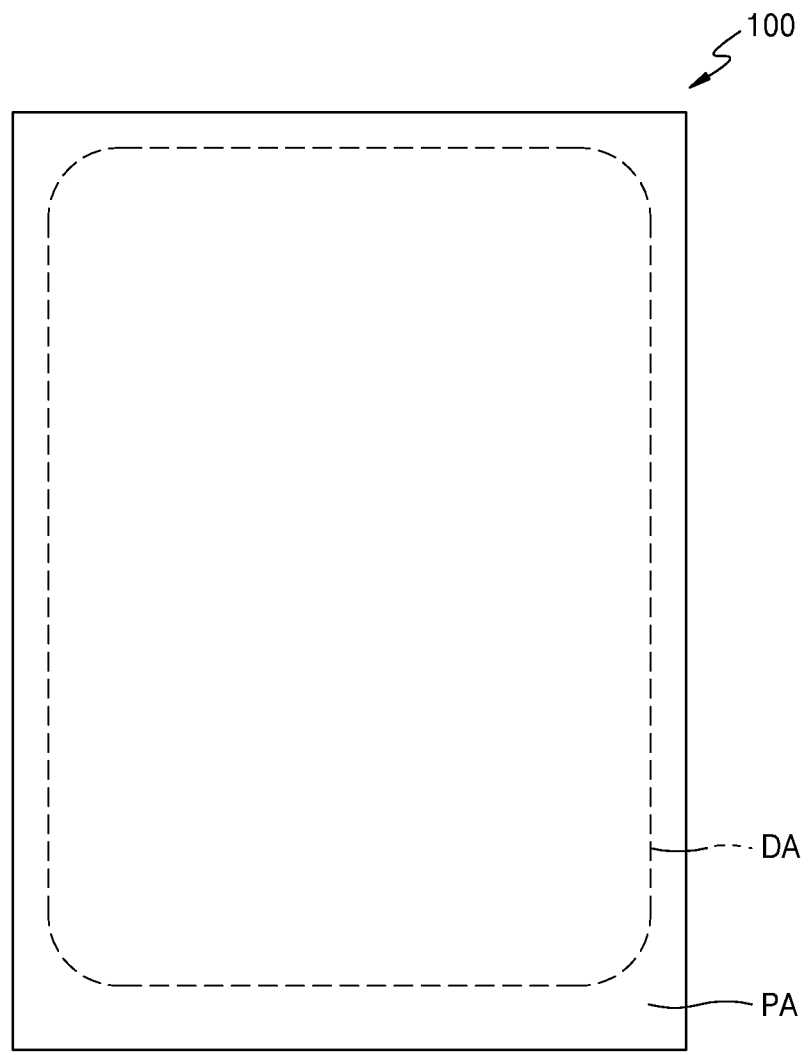
FIG. 1 is a schematic plan view of a substrate included in a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the disclosure, the expression "at least one of a, b, and, c" or "at least one of a, b, or c" indicates only a, only b, only c, both a and b, both a and c, both b and c, all of a, b, and c, or variations thereof.

Because various modifications may be applied to the disclosure and one or more embodiments may be implemented, specific embodiments will be shown in the drawings and described in detail in the detailed description. Effects and features of the disclosure and methods of achieving the same will be apparent with reference to embodiments described below in detail with the accompanying drawings. However, the disclosure is not limited to the embodiments disclosed below and may be implemented in various forms.

Hereinafter, the disclosure will be described in detail by explaining embodiments of the disclosure with reference to the attached drawings. Like reference numerals in the drawings denote like elements, and redundant explanations thereof are omitted.

In the following description, it will be understood that when an element, such as a layer, a film, an area, or a plate, is referred to as being "on" another element, the element may be "directly on" the other element or intervening elements may be present thereon. Also, sizes of elements in the drawings may be exaggerated or reduced for convenience of explanation. In other words, since sizes and thicknesses of elements in the drawings are arbitrarily illustrated for convenience of explanation, the following embodiments are not limited thereto.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes," and/or "including" are used in this specification, they or it may specify the presence of stated features, integers, steps, operations, elements and/or components, but does not preclude the presence or addition of other features, integers, steps, operations, elements, components, and/or any combination thereof.

Herein, the term "dead space" may be understood as a space which is devoted to accommodating one or more components that, either singularly or plurally, perform an intended function.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

Figure 2:
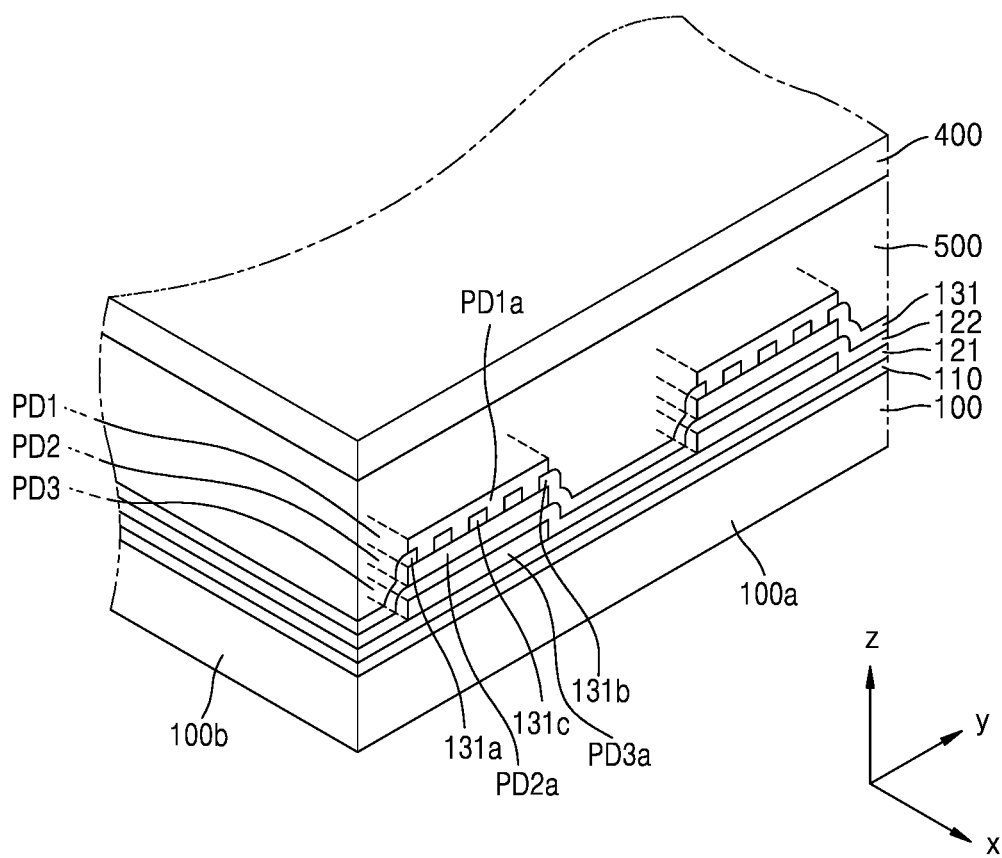
FIG. 2 is a schematic perspective view of a portion of a display device according to an embodiment.
Figure 3:
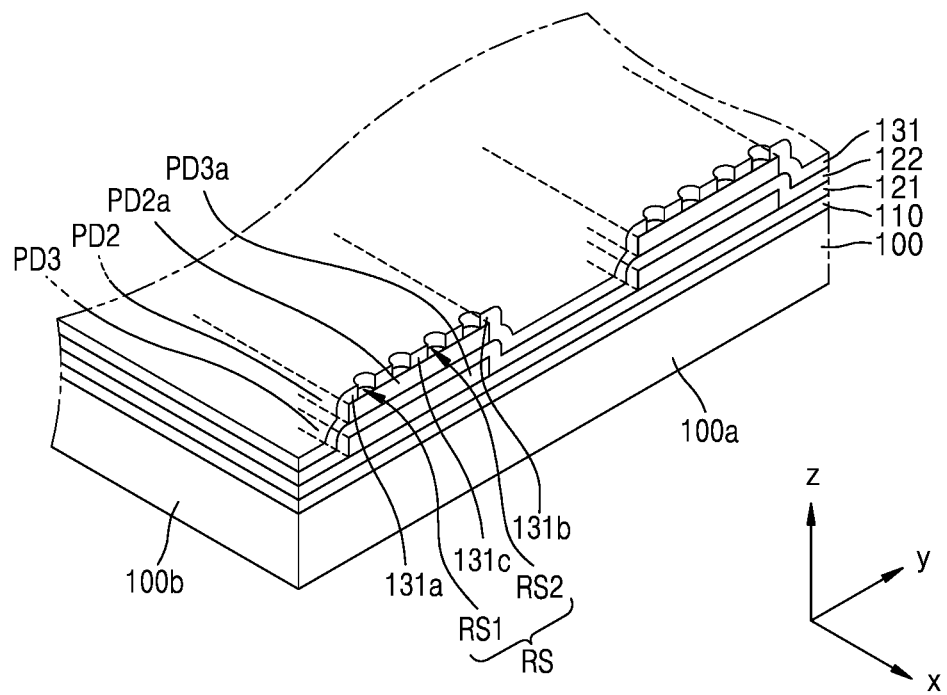
FIG. 3 is a schematic perspective view of a portion of the display device of FIG. 2.

FIG. 1 is a schematic plan view of a substrate 100 included in a display device according to an embodiment. FIG. 2 is a schematic perspective view of a portion of the display device according to an embodiment. FIG. 3 is a schematic perspective view of a portion of the display device of FIG. 2.

The display device according to an embodiment may include a substrate 100. As shown in FIG. 1, the substrate 100 includes a display area DA and a peripheral area PA outside the display area DA. The substrate 100 has an upper surface in a +z direction, a lower surface in a −z direction, and side surfaces 100a and 100b connecting the upper and lower surfaces to each other.

The substrate 100 may include glass, metal, or a polymer resin. In case that the substrate 100 is flexible or bendable, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including such a polymer resin and a barrier layer including an inorganic material (e.g., silicon oxide, silicon nitride, silicon oxynitride, etc.) between the two layers. However, various modifications may be made.

An edge of the display area DA may have overall a rectangular shape, a square shape, or a shape similar to a rectangle or a square. The substrate 100 may also have overall a rectangular shape, a square shape, or a shape similar to a rectangle or a square in a plan view. However, the embodiment is not limited thereto, and various modifications may be made. For example, the substrate 100 and the display area DA may have a curved shape in at least a portion thereof in a plan view.

A first insulating layer 131 is disposed over (or in) the peripheral area PA of the substrate 100. The first insulating layer 131 may include an inorganic material such as silicon oxide, silicon nitride, or silicon oxynitride. The first insulating layer 131 may have a single-layered structure or a multi-layered structure. The first insulating layer 131 may be disposed not only over the peripheral area PA of the substrate 100, but also over the display area DA. In this case, a portion of the first insulating layer 131 over the display area DA and a portion of the first insulating layer 131 over the peripheral area PA may be integrally connected to each other or may be spaced apart from each other.

The first insulating layer 131 includes a first side surface portion 131a, a second side surface portion 131b, and at least one recess portion RS (see FIG. 3). The first side surface portion 131a has a side surface aligned with the side surface 100a of the substrate 100 (in +x direction). Here, one side surface aligned with another side surface means that the one side surface and the other side surface form a continuous surface. The same is applied to embodiments below and modifications thereof. The second side surface portion 131*b* has a side surface aligned with the side surface 100*a* of the substrate 100 (in +x direction) and is spaced apart from the first side surface portion 131*a*. The at least one recess portion RS is between the first side surface portion 131*a* and the second side surface portion 131*b*.

A first pad PD1 (see FIG. 2) is located on the first insulating layer 131. The first pad PD1 extends to the edge of the substrate 100 to fill the at least one recess portion RS of the first insulating layer 131, and has a front end surface PD1*a* aligned with the side surface 100*a* of the substrate 100 (in +x direction).

Figure 4:
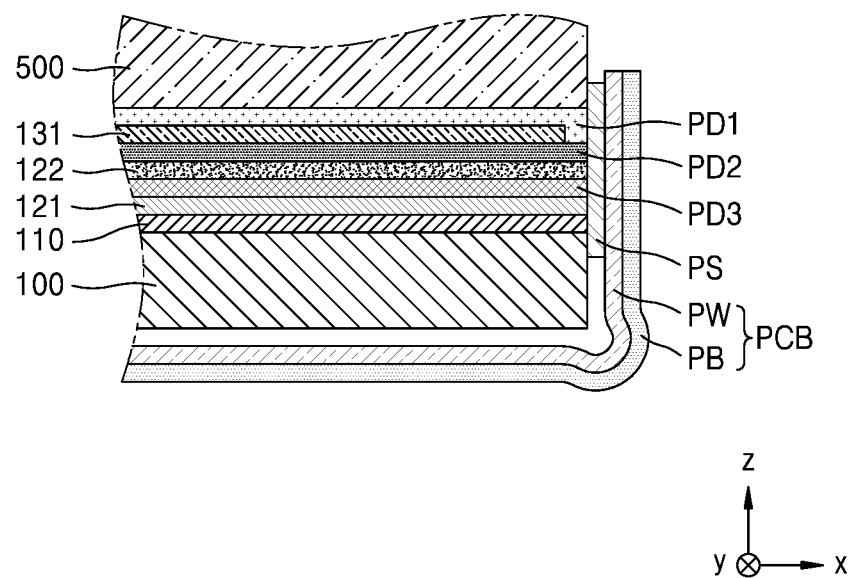
FIG. 4 is a schematic cross-sectional view of a portion of the display device of FIG. 2.

FIG. 4 is a schematic cross-sectional view of a portion of the display device of FIG. 2. As shown in FIG. 4, a printed circuit board PCB may be located over a side surface (in +x direction) and a lower surface of the substrate 100. The printed circuit board PCB may be flexible. For example, the printed circuit board PCB may include a flexible base layer PB formed of a resin and an electrode or a wire PW on the base layer PB. As another example, the printed circuit board PCB may include a flexible printed circuit board electrically connected to the substrate 100 and a rigid printed circuit board electrically connected to the flexible PCB.

The printed circuit board PCB may generate an electrical signal to be applied to a display device or the like located on the display area DA of the substrate 100 or may transmit the electrical signal to the display area DA. An integrated circuit element or the like may be located on the printed circuit board PCB. The electrode or the wire PW of the printed circuit board PCB may be electrically connected to the first pad PD1 on the side surface of the substrate 100 (in +x direction) by a conductive adhesive PS such as a silver (Ag) paste or an anisotropic conductive film. For example, the printed circuit board PCB is electrically connected to the front end surface PD1*a* (see, e.g., FIG. 2) of the first pad PD1, which is aligned with the side surface of the substrate 100 (in +x direction). Accordingly, the area of a dead space of the display device may be significantly reduced.

As described above, in the display device according to an embodiment, the first insulating layer 131 has the first side surface portion 131*a* and the second side surface portion 131*b*, each of which includes a side surface aligned with the side surface 100*a* of the substrate 100 (in +x direction) and are spaced apart from each other, and the at least one recess portion RS is between the first side surface portion 131*a* and the second side surface portion 131*b*. The first pad PD1 (see FIG. 2) on the first insulating layer 131 extends to the edge of the substrate 100 to fill the at least one recess portion RS of the first insulating layer 131 and has the front end surface PD1*a* aligned with the side surface 100*a* of the substrate 100 (in +x direction). Accordingly, the area of the front end surface PD1*a* of the first pad PD1 aligned with the side surface of the substrate 100 (in +x direction) may be sufficiently enlarged, and as a result, an electrical contact area between the first pad PD1 and the printed circuit board PCB may also be sufficiently enlarged. Accordingly, a contact defect occurrence rate between the first pad PD1 and the printed circuit board PCB may be reduced.

In case that the first insulating layer 131 does not include at least one recess portion RS and the first pad PD1 is located only on the first insulating layer 131, the area of the front end surface PD1*a* of the first pad PD1 aligned with the side surface 100*a* of the substrate 100 (in +x direction) may be narrow. In this case, a contact resistance between the first pad PD1 and the printed circuit board PCB is high, such that an electrical signal from the printed circuit board PCB may not be smoothly transmitted to the display area DA. However, because the first insulating layer 131 includes at least one recess portion RS and the first pad PD1 fills the at least one recess portion RS, the area of the front end surface PD1*a* of the first pad PD1, aligned with the side surface 100*a* of the substrate 100 (in +x direction), is increased by the presence of the recess portion RS. As a result, the contact resistance between the first pad PD1 and the printed circuit board PCB may be significantly reduced.

The first insulating layer 131 may further include a third side surface portion 131*c* between the first side surface portion 131*a* and the second side surface portion 131*b* and having a side surface aligned with the side surface 100*a* of the substrate 100 (in +x direction). Accordingly, the at least one recess portion RS includes a first recess portion RS1 between the first side surface portion 131*a* and the third side surface portion 131*c* and a second recess portion RS2 between the second side surface portion 131*b* and the third side surface portion 131*c*. The first pad PD1 may fill both the first recess portion RS1 and the second recess portion RS2. As can be seen from FIGS. 2 and 3, as the number of recess portions RS of the first insulating layer 131 increases, the area of the front end surface PD1*a* of the first pad PD1 aligned with the side surface 100*a* of the substrate 100 (in +x direction) increases. Therefore, the contact resistance between the first pad PD1 and the printed circuit board PCB may be effectively reduced.

The display device according to an embodiment may further include a second pad PD2 in addition to the first pad PD1. For example, as shown in FIGS. 2 to 4, the second pad PD2 may be between the substrate 100 and the first pad PD1 and may include a front end surface PD2*a* that contacts the first pad PD1 and is aligned with the side surface 100*a* of the substrate 100 (in +x direction). The first insulating layer 131 between the first pad PD1 and the second pad PD2 may cover both side edges (extending along an x-axis) connected to the front end surface PD2*a* of the second pad PD2. In this case, the first insulating layer 131 may be between the first pad PD1 and the second pad PD2, but the first pad PD1 and the second pad PD2 may contact each other through the at least one recess portion RS of the first insulating layer 131. For example, the at least one recess portion RS of the first insulating layer 131 may expose an upper surface of the second pad PD2 below the first insulating layer 131, and the first pad PD1 may fill the at least one recess portion RS and thus may contact the second pad PD2 through the at least one recess portion RS. In addition to the first pad PD1, the front end surface PD2*a* of the second pad PD2 may also be electrically connected to the printed circuit board PCB by the conductive adhesive PS. Accordingly, the electrical signal from the printed circuit board PCB may be smoothly transmitted to the display area DA.

Furthermore, the display device may further include a third pad PD3 below the second pad PD2 and a second insulating layer 122 between the third pad PD3 and the second pad PD2. The third pad PD3 may include a front end surface PD3*a* aligned with the side surface 100*a* of the substrate 100 (in +x direction). In addition to the first pad PD1 and the second pad PD2, the front end surface PD3*a* of the third pad PD3 may also be electrically connected to the printed circuit board PCB by the conductive adhesive PS. Accordingly, the electrical signal from the printed circuit board PCB may be smoothly transmitted to the display area DA. If desired, a through-hole or the like is formed in the second insulating layer 122 such that the second pad PD2 may be connected to the third pad PD3.

Figure 5:
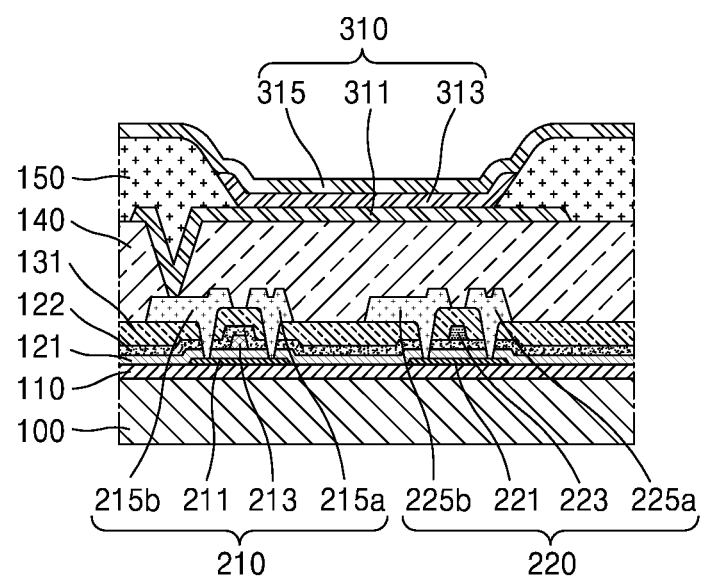
FIG. 5 is a schematic cross-sectional view of a portion of the display device of FIG. 2.

FIG. 5 is a schematic cross-sectional view of a portion of the display device of FIG. 2. Specifically, FIG. 5 is a schematic cross-sectional view of a portion of the display area DA in the display device of FIG. 2. For reference, only a portion of the display device is shown in FIG. 2 for convenience, and if desired, a planarization layer 140 or a pixel-defining layer 150, which will be described below, may also include a side surface aligned with the side surface 100a of the substrate 100 (in +x direction).

A display element 310 and first and second thin-film transistors 210 and 220 to which the display element 310 is electrically connected may be located in the display area DA of the substrate 100. In FIG. 5, it is shown that an organic light-emitting element is located in the display area DA as the display element 310. It may be understood that the organic light-emitting element electrically connected to the first thin-film transistor 210 means that a pixel electrode 311 is electrically connected to the first thin-film transistor 210.

In FIG. 5, it is shown that the second thin-film transistor 220 is also located in one pixel, in addition to the first thin-film transistor 210. Similarly, multiple thin-film transistors may be located in one pixel. The first thin-film transistor 210 and the second thin-film transistor 220 may have a similar or identical structure.

The first thin-film transistor 210 may include a first semiconductor layer 211, a first gate electrode 213, a first source electrode 215a, and a first drain electrode 215b, the first semiconductor layer 211 including amorphous silicon, polycrystalline silicon, or an organic semiconductor material. The first gate electrode 213 may include various conductive materials and may have various layered structures, for example, a molybdenum (Mo) layer and an aluminum (Al) layer. The first source electrode 215a and the first drain electrode 215b may also include various conductive materials and may have various layered structures, for example, a titanium (Ti) layer and an Al layer.

In order to secure insulation between the first semiconductor layer 211 the first gate electrode 213, a first gate insulating layer 121 may be between the first semiconductor layer 211 and the first gate electrode 213, the first semiconductor layer 211 including an inorganic material such as silicon oxide, silicon nitride, and/or silicon oxynitride. An interlayer insulating layer 131 may be arranged on the first gate electrode 213. The interlayer insulating layer 131 may include an inorganic material such as silicon oxide, silicon nitride, silicon oxynitride, titanium oxide, or aluminum oxide. The first source electrode 215a and the first drain electrode 215b may be arranged on the interlayer insulating layer 131. An insulating layer including the inorganic material may be formed by chemical vapor deposition (CVD) or atomic layer deposition (ALD). The same is applied to embodiments below and modifications thereof.

The second thin-film transistor 220 may include a second semiconductor layer 221 in a similar manner to or the same manner as the first semiconductor layer 211 of the first thin-film transistor 210. However, a second gate electrode 223 may be located on the second gate insulating layer 122 covering the first gate electrode 213, unlike the first gate electrode 213 being arranged on the first gate insulating layer 121. The second gate insulating layer 122 may include an inorganic material such as silicon oxide, silicon nitride, and/or silicon oxynitride. The interlayer insulating layer 131 may cover the second gate electrode 223, and a second source electrode 225a and a second drain electrode 225b may be arranged on the interlayer insulating layer 131.

If desired, the second gate electrode 223 may also be located on the first gate insulating layer 121 in the same manner as first gate electrode 213. In this case, wirings may be arranged between the first gate insulating layer 121 and the second gate insulating layer 122.

A buffer layer 110 may be between the substrate 100 and the first and second thin-film transistors 210 and 220 having the structure described above. The buffer layer 110 may include at least one of silicon oxide, silicon nitride, silicon oxynitride, titanium oxide, and aluminum oxide. The buffer layer 110 may enhance the flatness of an upper surface of the substrate 100, or may prevent or minimize penetration of impurities from the substrate 100 or the like into the first semiconductor layer 211 of the first thin-film transistor 210 or the second semiconductor layer 221 of the second thin-film transistor 220.

In addition, the planarization layer 140 may be arranged on the first thin-film transistor 210 and the second thin-film transistor 220. For example, as shown in FIG. 5, in case that the organic light-emitting element is arranged on the first and second thin-film transistors 210 and 220, the planarization layer 140 may substantially planarize upper parts of the first and second thin-film transistors 210 and 220. The planarization layer 140 may be formed of an organic material such as acryl resin, epoxy resin, phenolic resin, polyamide resin, polyimide resin, benzocyclobutene (BCB), or hexamethyldisiloxane (HMDSO). In FIG. 5, it is shown that the planarization layer 140 is a single layer. However, the planarization layer 140 may be a multi-layer, and various modifications may be made.

In the display area DA of the substrate 100, the display element 310 may be located on the planarization layer 140. The display element 310 may be, for example, an organic light-emitting element including a pixel electrode 311, an opposite electrode 315, and an intermediate layer 313 disposed therebetween and including an emission layer. As shown in FIG. 5, the pixel electrode 311 may contact one of the first source electrode 215a and the first drain electrode 215b through an opening formed in the planarization layer 140 and may be electrically connected to the first thin-film transistor 210.

For a top emission display device that emits light to the outside through the opposite electrode 315, the pixel electrode 311 may be formed of a metal material having high reflectivity, such as a stacked structure of aluminum and titanium (Ti/Al/Ti), a stacked structure of aluminum and indium tin oxide (ITO) (ITO/Al/ITO), an APC alloy, or a stacked structure of an APC alloy and ITO (ITO/APC/ITO). The APC alloy is an alloy of silver (Ag), palladium (Pd), and/or copper (Cu). In a bottom emission display device that emits light to the outside through the pixel electrode 311, the pixel electrode 311 may include a transparent conductive material, such as ITO or IZO, capable of transmitting light, or a semi-transmissive conductive material, such as magnesium (Mg), Ag, or an alloy of Mg and Ag.

A pixel-defining layer 150 may be arranged on the planarization layer 140. The pixel-defining layer 150 defines a pixel by including an opening corresponding to each sub-pixel, which may be an opening exposing at least a central portion of the pixel electrode 311. As shown in FIG. 5, the pixel-defining layer 150 may prevent an arc or the like from being generated at an edge of the pixel electrode 311 by increasing a distance between the edge of the pixel electrode 311 and the opposite electrode 315 above the pixel electrode 311. The pixel-defining layer 150 may be formed of an organic material such as acryl resin, epoxy resin, phenolic resin, polyamide resin, polyimide resin, or HMDSO.

The intermediate layer 313 of the organic light-emitting element may include a low molecular weight material or a polymer material. In case that the intermediate layer 313 includes a low molecular weight material, the intermediate layer 313 may have a structure in which a hole injection layer (HIL), a hole transport layer (HTL), an emission layer (EML), an electron transport layer (ETL), an electron injection layer (EIL), or the like are stacked in a single or composite structure and may be formed by a vacuum deposition method. In case that the intermediate layer 313 includes a polymer material, the intermediate layer 313 may have a structure including an HTL and an EML. In this case, the HTL may include poly(3,4-ethylenedioxythiophene) (PEDOT), and the EML may include a polymer material, such as a poly-phenylenevinylene (PPV)-based material or a polyfluorene-based material. The intermediate layer 313 may be formed by screen printing, inkjet printing, laser induced thermal imaging (LITI), or the like. However, the intermediate layer 313 is not limited thereto and may have various structures. The intermediate layer 313 may include an integrated layer over a plurality of pixel electrodes 311, or may include a layer patterned to correspond to each of the pixel electrodes 311.

The opposite electrode 315 may be arranged on the display area DA to cover the display area DA. For example, the opposite electrode 315 for multiple organic light-emitting elements may be formed as one element that corresponds to the pixel electrodes 311. In a top-emission type display device, the opposite electrode 315 may include a transparent conductive material (TCO), such as ITO or IZO, capable of transmitting light, or a semi-transmissive conductive material, such as Mg, Ag, or an alloy of Mg and Ag. In a bottom emission type display device, the opposite electrode 315 may include a metal material having high reflectivity, such as a stacked structure of aluminum and titanium (Ti/Al/Ti), a stacked structure of aluminum and ITO (ITO/Al/ITO), an APC alloy, or a stacked structure of an APC alloy and ITO (ITO/APC/ITO). The APC alloy is an alloy of Ag, Pd, and/or Cu.

The opposite electrode 315 covers the display area DA and extends to the peripheral area PA outside the display area DA. The opposite electrode 315 is electrically connected to an electrode power supply line in the peripheral area PA. The electrode power supply line may also be referred to as ELVSS.

Because the organic light-emitting element may be easily damaged by external moisture or oxygen, an encapsulation layer (not shown) may cover the organic light-emitting element to protect the organic light-emitting element. The encapsulation layer may cover the display area DA and may extend to at least a portion of the peripheral area PA. The encapsulation layer may include a first inorganic encapsulation layer, an organic encapsulation layer, and a second inorganic encapsulation layer. The first and second inorganic encapsulation layers may include silicon nitride, silicon oxynitride, silicon oxide, titanium oxide, or aluminum oxide. The organic encapsulation layer may include acryl resin, epoxy resin, phenolic resin, polyamide resin, polyimide resin, or the like. In addition, if desired, an upper substrate 400 may be located on the substrate 100 as shown in FIG. 2. In this case, a filler 500 may fill a space under the upper substrate 400.

A data line, a power line, and the like are arranged in the display area DA of the substrate 100, and various wires may be located in the peripheral area PA. For example, as described above, the electrode power supply line or the like may be located in the peripheral area PA. A power supply line may be located in the peripheral area PA, and a power line, also referred to as a Vdd line, extending into the display area DA may be electrically connected to the power supply line to supply power to pixels in the display area DA. For example, the power line may be substantially parallel to the data line.

The first insulating layer 131 and the second insulating layer 122 described with reference to FIGS. 2 to 4 may correspond to the interlayer insulating layer 131 and the second gate insulating layer 122 of FIG. 5. For example, the first insulating layer 131 shown in FIGS. 2 to 4 and the interlayer insulating layer 131 shown in FIG. 5 may be formed as one element. The first insulating layer 131 shown in FIGS. 2 to 4 may be spaced apart from the interlayer insulating layer 131 of FIG. 5, but the first insulating layer 131 and the interlayer insulating layer 131 may be simultaneously formed of the same material in a manufacturing process of a display device. The second insulating layer 122 shown in FIGS. 2 through 4 and the second gate insulating layer 122 of FIG. 5 may be formed as one element. The second insulating layer 122 shown in FIGS. 2 through 4 may be spaced apart from the second gate insulating layer 122 of FIG. 5, but may be simultaneously formed of the same material in the process of manufacturing the display device.

The first pad PD1 described with reference to FIGS. 2 to 4, the first source electrode 215a, and the first drain electrode 215b may be simultaneously formed of a same material. Similarly, the second pad PD2 and the second gate electrode 223 may be simultaneously formed of a same material, and the third pad PD3 and the first gate electrode 213 may be simultaneously formed of a same material. The same may be applied to embodiments below and modifications thereof. As described above, if desired, the second gate electrode 223 may be located on the first gate insulating layer 121 in the same manner as the first gate electrode 213, and a wire may be between the first gate insulating layer 121 and the second gate insulating layer 122. In this case, the second pad PD2 and the wire may be simultaneously formed of a same material.

In the manufacturing of the display device, the following processes may be performed: forming the buffer layer 110, the first gate insulating layer 121, the second gate insulating layer 122, and the interlayer insulating layer 131 on the entire surface of the substrate 100; forming other elements, and then cutting the substrate 100. As the substrate 100 is cut, the front end surface PD1a of the first pad PD1 is aligned with the side surface 100a of the substrate 100 (in +x direction), as shown in FIG. 2, such that all of the buffer layer 110, the first gate insulating layer 121, the second gate insulating layer 122, and the interlayer insulating layer 131 may have a side surface aligned with the side surface 100a of the substrate 100 (in +x direction).

Figure 6:
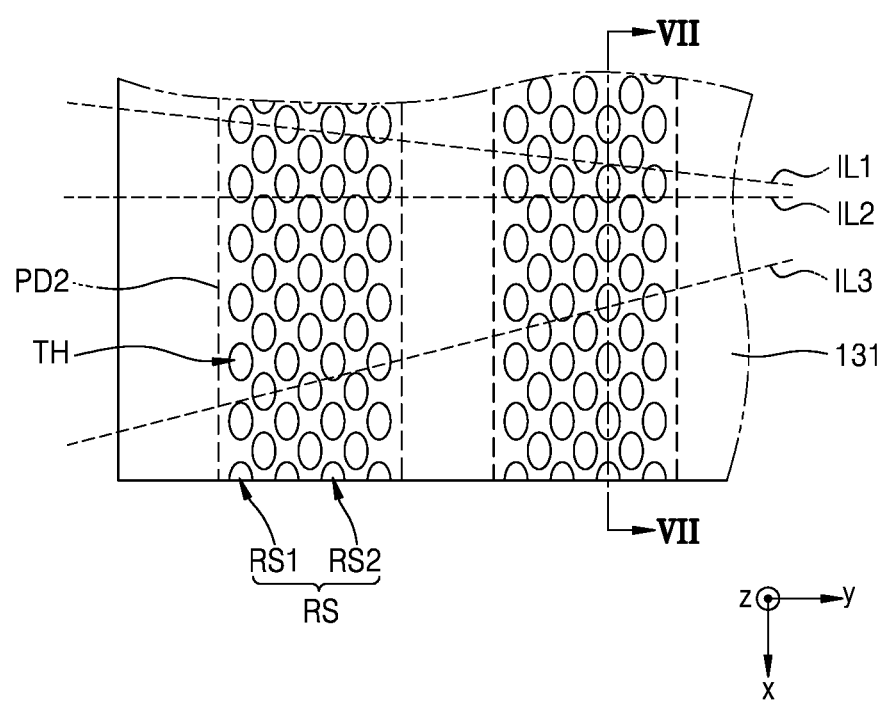
FIG. 6 is a schematic plan view of a portion of a display device according to another embodiment.
Figure 7:
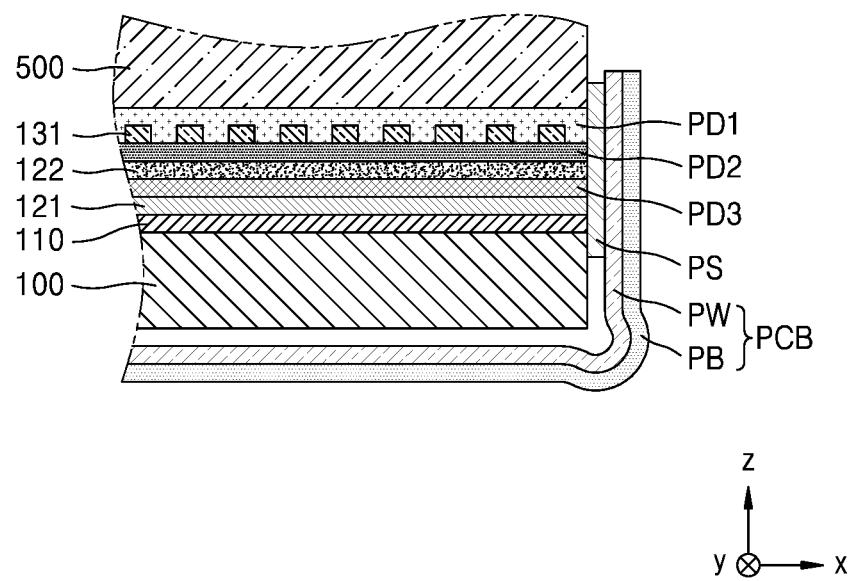
FIG. 7 is a schematic cross-sectional view of the display device taken along line VII-VII of FIG. 6.

FIG. 6 is a schematic plan view of a portion of a display device according to another embodiment, and FIG. 7 is a schematic cross-sectional view of a cross-section of the display device taken along line VII-VII of FIG. 6.

As shown in FIGS. 6 and 7, the first insulating layer 131 may have through holes TH extending in a direction (+z direction) perpendicular to the substrate 100. In this case, the first pad PD1 on the first insulating layer 131 may fill the plurality of through holes TH. In FIGS. 6 and 7, it is shown that each of the through holes TH has a circular or elliptical shape in a plan view, but the embodiment is not limited thereto. For example, each of the through holes TH may have a quadrangular shape in a plan view. However, various modifications may be made. The same may be applied to embodiments below and modifications thereof.

As described above, in the manufacturing of the display device, the following processes may be performed: forming the buffer layer 110, the first gate insulating layer 121, the second gate insulating layer 122, and the interlayer insulating layer 131 on the entire surface of the substrate 100; forming other elements; and then cutting the substrate 100. As the substrate 100 is cut, the front end surface PD1a of the first pad PD1 aligned with the side surface 100a of the substrate 100 (in +x direction), as shown in FIG. 2. In this case, as shown in FIG. 2, as the substrate 100 is cut, the recess portion RS of the first insulating layer 131 should also be cut such that the front end surface PD1a of the first pad PD1 may have a large area. Therefore, the first insulating layer 131 may have the through holes TH extending in the direction (+z direction) perpendicular to the substrate 100, such that the front end surface PD1a of the first pad PD1 has a large area even though the substrate 100 is cut at a substantially arbitrary location. This is because a through hole TH being cut out among the holes TH may be the recess portion RS of the first insulating layer 131.

The first pad PD1 may have a shape extending along a long axis (x-axis), and the through holes TH of the first insulating layer 131 may be arranged in a zigzag pattern in a direction (y-axis direction) perpendicular to the long axis (x-axis). Accordingly, for example, as the substrate 100 is cut along a cutting line parallel to a y-axis, such as a second virtual line IL2 of FIG. 6, even though a location of the cutting line is slightly changed along the x-axis, a part of the plurality of through holes TH may be always cut, such that the front end surface PD1a of the first pad PD1 may have a large area.

The through holes TH may be arranged such that a virtual straight line, which is parallel to the upper surface of the substrate 100 and passes through the first pad PD1, passes through at least one of the through holes TH. In FIG. 6, it is shown that all of a first virtual line IL1, the second virtual line IL2, and a third virtual line IL3, which are parallel to an xy-plane and pass through the first pad PD1, pass through at least one of the through holes TH. Accordingly, as the substrate 100 is cut, even in case that the location of the cutting line is changed, a part of the through holes TH may be always cut, such that the front end surface PD1a of the first pad PD1 may have a large area.

The through holes TH of the first insulating layer 131 may be arranged such that a virtual plane (yz-plane) parallel to the side surface 100a of the substrate 100 (in +x direction) passes through at least one of the through holes TH. Accordingly, even in case that a location of a side surface 100a to be formed by cutting the substrate 100 is slightly changed along the x-axis during the manufacturing process, a part of the through holes TH may be always cut, such that the front end surface PD1a of the first pad PD1 may have a large area. For example, in a plan view with respect to the substrate 100, the plurality of through holes TH may be arranged randomly.

Figure 8:
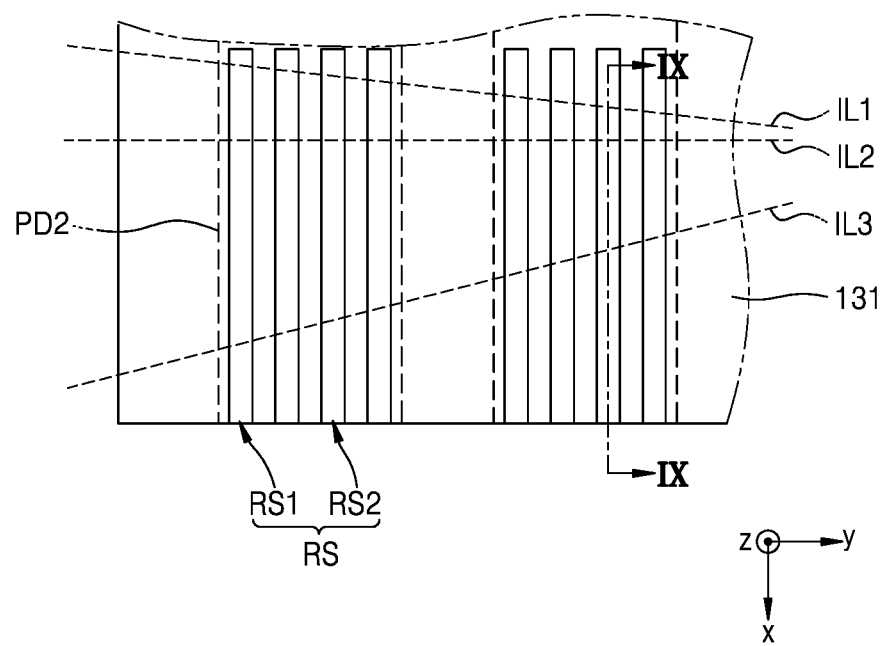
FIG. 8 is a schematic plan view of a portion of a display device according to another embodiment.
Figure 9:
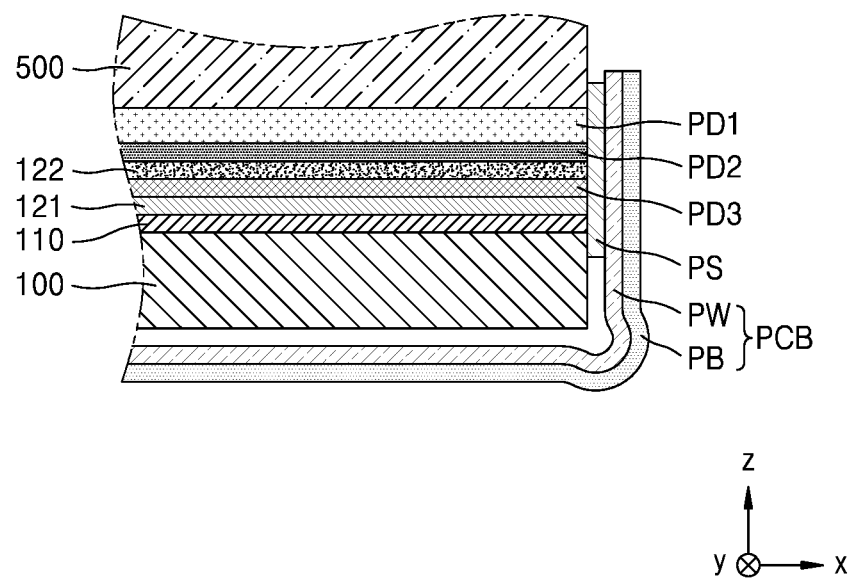
FIG. 9 is a schematic cross-sectional view of the display device taken along line IX-IX of FIG. 8.

FIG. 8 is a schematic plan view of a portion of a display device according to an embodiment, and FIG. 9 is a schematic cross-sectional view of a cross-section of the display device taken along line IX-IX of FIG. 8.

The first insulating layer 131 of the display device according to an embodiment does not have through holes TH. Instead, each of at least one recess portion RS of the first insulating layer 131 has a slit shape extending in a direction (−x direction) away from the side surface 100a of the substrate 100. The first pad PD1 on the first insulating layer 131 fills the at least one recess portion RS of the slit shape. Accordingly, even in case that the location of the cutting line is changed as the substrate 100 is cut during the manufacturing process, a slit is always cut, such that the front end surface PD1a of the first pad PD1 may have a large area. In FIG. 8, it is shown that all of the first virtual line IL1, the second virtual line IL2 and the third virtual line IL3, which are parallel to the xy-plane and pass through the first pad PD1, always pass through the at least one recess portion RS of the slip shape.

In this case, the first insulating layer 131 may include a third side surface portion 131c (see, e.g., FIG. 2) between the first side surface portion 131a and the second side surface portion 131b and may have a side surface aligned with the side surface 100a of the substrate 100 (in +x direction). As shown in FIG. 8, the at least one recess portion RS may include a first recess portion RS1 and a second recess portion RS2, the first recess portion RS1 being between the first side surface portion 131a and the third side surface portion 131c and having a slit shape extending in a direction (−x direction) away from the side surface 100a of the substrate 100, and the second recess portion RS2 being between the second side surface portion 131b and the third side surface portion 131c and having a slit shape extending in the direction (−x direction) away from the side surface of the substrate 100. In this case, the first and second recesses RS1 and RS2 may be parallel to each other.

In FIGS. 2 and 3, it is shown that the first insulating layer 131 on the substrate 100 has at least one recess portion RS on a side surface thereof, and thus, all side surfaces of the first insulating layer 131 other than the side surface where the at least one recess portion RS is disposed are aligned with the side surfaces 100a and 100b of the substrate 100. However, the embodiment is not limited thereto.

Figure 10:
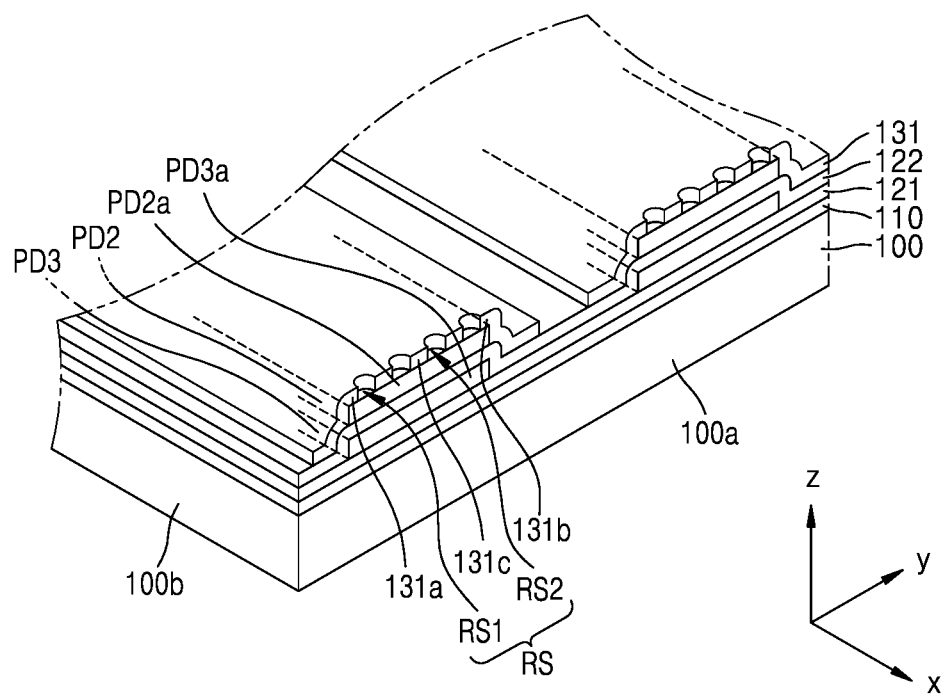
FIG. 10 is a schematic perspective view of a portion of a display device according to another embodiment.

For example, as shown in FIG. 10, which is a schematic perspective view of a portion of a display device according to an embodiment, all side surfaces of the first insulating layer 131 except for the at least one recess portion RS are not required to be aligned with the side surfaces 100a and 100b of the substrate 100. As shown in FIG. 10, a side surface of the first insulating layer 131 (in −y direction) may not be aligned with a side surface 100b of the substrate 100 (in −y direction), but may be disposed inside the substrate 100 in a plan view. A side surface of the first insulating layer 131 (in +x direction) may not be required to be aligned with a side surface 100a of the substrate 100 (in +x direction) in all portions. For example, it may be sufficient if each of the first side surface portion 131a and the second side surface portion 131b of the first insulating layer 131 has a side surface aligned with the side surface 100a of the substrate 100 (in +x direction), and the at least one recess portion RS is arranged between the first side surface portion 131a and the second side surface portion 131b. The first insulating layer 131 may include the third side surface portion 131c between the first side surface portion 131a and the second side surface portion 131b and may have the side surface aligned with the side surface 100a of the substrate 100 (in +x direction), and the at least one recess portion RS may include the first recess portion RS1 between the first side surface portion 131a and the third side surface portion 131c and the second recess portion RS2 between the second side surface portion 131b and the third side surface portion 131c.

Figure 11:
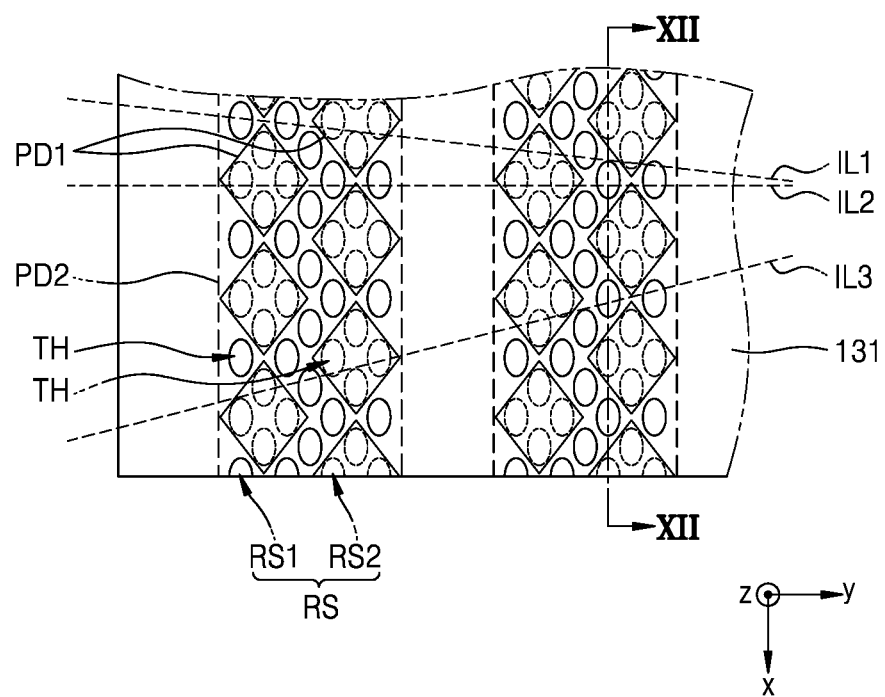
FIG. 11 is a schematic plan view of a portion of a display device according to another embodiment.
Figure 12:
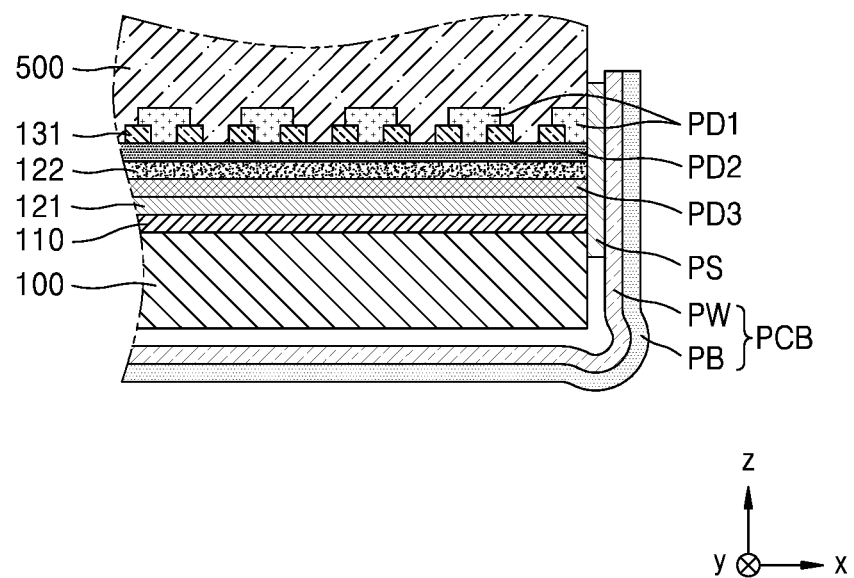
FIG. 12 is a schematic cross-sectional view of the display device taken along line XII-XII of FIG. 11.

FIG. 11 is a schematic plan view of a portion of a display device according to an embodiment, and FIG. 12 is a schematic cross-sectional view of a schematic cross-section of the display device taken along line XII-XII of FIG. 11.

In the display device according to the embodiment, the first insulating layer 131 has a first side surface portion 131a, a second side surface portion 131b, at least one recess portion RS between the first side surface portion 131a and the second side surface portion 131b, and through holes TH extending in a direction (+z direction) perpendicular to the substrate 100. Each of the first side surface portion 131*a* and the second side surface portion 131*b* has a side surface aligned with the side surface 100*a* of the substrate 100 (in +x direction).

The display device according to the embodiment may have first pads PD1. The first pads PD1 are disposed on the first insulating layer 131, fill at least one recess portion RS and at least a part of the through holes TH, and are spaced apart from each other. In FIG. 11, each of the first pads PD1 has a rhombus shape in a plan view, but the embodiment is not limited thereto. For example, each of the first pads PD1 may have a circular or elliptical shape in a plan view, or may have a rectangular or square shape. However, various modifications may be made. The same may be applied to embodiments below and modifications thereof.

The second pad PD2 below the first pads PD1 may contact the first pads PD1 by the through holes TH or the recess portion RS. The second pad PD2 has a front end surface PD2*a* (see, e.g., FIG. 2) aligned with the side surface 100*a* of the substrate 100 (in +x direction). At least a part of the first pads PD1 may have a front end surface PD1*a* (see, e.g., FIG. 2) aligned with the side surface 100*a* of the substrate 100 (in +x direction).

Even in the display device according to the embodiment, the recess portion RS of the first insulating layer 131 may sufficiently secure the area of a front end surface of a pad contacting a printed circuit board PCB.

As shown in FIG. 2, in case that the filler 500 contacts the first pad PD1, a chemical reaction may occur between the filler 500 and the first pad PD1. For example, in case that the first pad PD1 includes a material such as aluminum and the filler 500 includes frit, a so-called hillock phenomenon, in which a part of the material such as aluminum included in the first pad PD1 is melted and protrudes out of the first pad PD1, may occur. Accordingly, a short circuit may occur between first pads PD1 adjacent to and parallel to each other as shown in FIG. 2.

In the display device according to the embodiment, because the first pads PD1 are disposed on the second pad PD2 to be spaced apart from each other, even in case that the first pad PD1 includes a material that may cause the hillock phenomenon to occur, a total amount of materials included in the first pads PD1 disposed on the second pad PD2 may be greatly reduced. Therefore, even in case that the hillock phenomenon occurs in the first pad PD1, a size of a protrusion protruding out of the first pad PD1 may be reduced, such that a protrusion from a first pad PD1 on one second pad PD2 may not reach a first pad PD1 on another second pad PD2 neighboring the one second pad PD2. As a result, an electrical short may be efficiently prevented from occurring between second pads PD2 arranged in parallel to each other.

Although it is shown in FIG. 11 that one first pad PD1 fills the through holes TH of the first insulating layer 131, the embodiment is not limited thereto. For example, one first pad PD1 may fill only one of the through holes TH of the first insulating layer 131, and thus, the first pads PD1 may correspond to the through holes TH in a one-to-one manner.

In the manufacturing of the display device, the following processes are performed: forming the buffer layer 110, the first gate insulating layer 121, the second gate insulating layer 122, and the interlayer insulating layer 131 on the entire surface of the substrate 100, forming other elements, and then cutting the substrate 100. As the substrate 100 is cut, front end surfaces PD1*a* of a part of the first pads PD1 may be aligned with the side surface 100*a* of the substrate 100 (in +x direction), as shown in FIG. 11. In this case, even in case that a substantially arbitrary location on the substrate 100 is cut, the front end surfaces PD1*a* of a part of the first pads PD1 may have a large area.

To this end, the second pad PD2 may have a shape extending along a long axis (x-axis), and the through holes TH of the first insulating layer 131 may be arranged in a zigzag pattern along a direction (y-axis direction) perpendicular to the long axis (x-axis). Accordingly, for example, as the substrate 100 is cut along a cutting line parallel to a y-axis as indicated by a second virtual line IL2 of FIG. 11, even in case that a location of the cutting line is slightly changed along the x-axis, a part of the through holes TH may be always cut, such that the front end surface PD1*a* of the first pad PD1 may have a large area.

Furthermore, the through holes TH may be arranged such that a virtual straight line, which is parallel to the upper surface of the substrate 100 and passes through the second pad PD2, passes through at least one of the plurality of through holes TH. In FIG. 11, it is shown that all of a first virtual line IL1, the second virtual line IL2, and a third virtual line IL3, which are parallel to an xy-plane and pass through the second pad PD2, pass through at least one of the through holes TH. Accordingly, as the substrate 100 is cut, even in case that the location of the cutting line is changed, a part of the through holes TH may be always cut, such that the front end surface PD1*a* of the first pad PD1 may have a large area.

The through holes TH of the first insulating layer 131 may be arranged such that a virtual plane (yz-plane) parallel to the side surface 100*a* of the substrate 100 (in +x direction) passes through at least one of the through holes TH. Accordingly, even in case that a location of a side surface 100*a* to be formed by cutting the substrate 100 is slightly changed along the x-axis during the manufacturing process, a part of the through holes TH may be always cut, such that the front end surface PD1*a* of the first pad PD1 may have a large area. As another example, in a plan view with respect to the substrate 100, the through holes TH may be arranged randomly.

Figure 13:
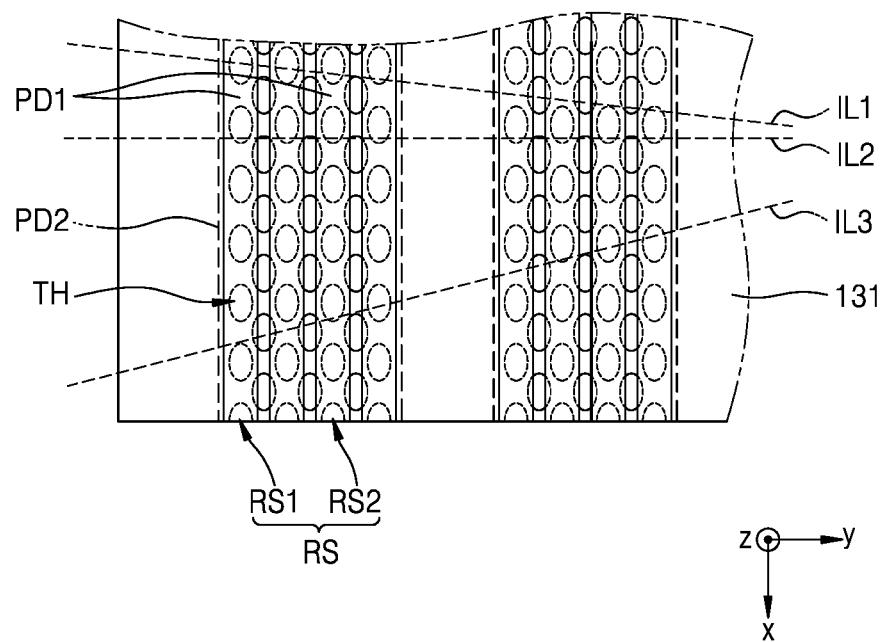
FIG. 13 is a schematic plan view of a portion of a display device according to another embodiment.

As described above, the first pads PD1 may have various shapes. For example, as shown in FIG. 13, which is a schematic plan view of a portion of a display device according to an embodiment, each of the first pads PD1 may have a shape extending along an x-axis in the same manner as the second pad PD2. However, first pads PD1 that are spaced apart from each other may be located on one second pad PD2 in a y-axis direction, such that a total amount of materials that may cause the hillock phenomenon to occur, included in the first pads PD1 on one second pad PD2, may be reduced.

Figure 14:
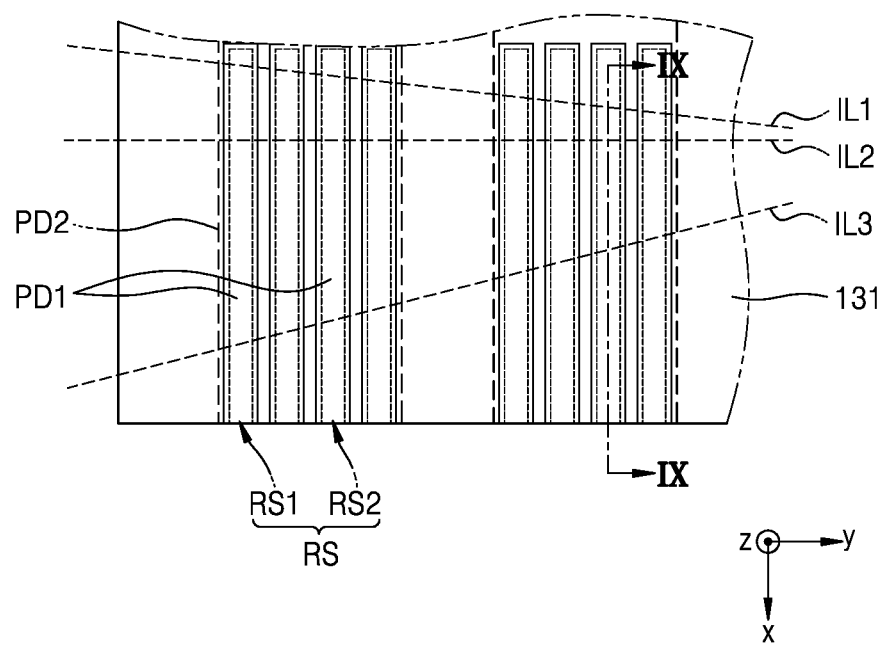
FIG. 14 is a schematic plan view of a portion of a display device according to another embodiment.

As shown in FIG. 14, which is a schematic plan view of a portion of a display device according to an embodiment, the first insulating layer 131 may not have through holes TH. Instead, in the display device according to the embodiment, each of at least one recess portion RS of the first insulating layer 131 has a slit shape extending in a direction (−x direction) away from the side surface 100*a* of the substrate 100. First pads PD1 on the first insulating layer 131, which are spaced apart from each other, fill the recess portion RS of the slit shape. A cross-section of the display device taken along line IX-IX of FIG. 14 may be shown as in FIG. 9.

Because the display device has the structure described above, as the substrate 100 is cut during the manufacturing process, a slit may be always cut even though the location of the cutting line is changed, such that the front end surface PD1*a* of the first pad PD1 may have a large area. In FIG. 14, it is shown that all of a first virtual line IL1, a second virtual line IL2 and a third virtual line IL3, which are parallel to an xy-plane and pass through the first pad PD1, always pass through the recess portion RS of the slit shape. A total amount of materials that may cause the hillock phenomenon to occur, included in first pads PD1 on one second pad PD2, may be reduced.

In this case, the first insulating layer 131 may include a third side surface portion 131c (see, e.g., FIG. 2) between the first side surface portion 131a and the second side surface portion 131b and having a side surface aligned with the side surface 100a of the substrate 100 (in +x direction). As shown in FIG. 14, the at least one recess portion RS may include a first recess portion RS1 and a second recess portion RS2, the first recess portion RS1 being between the first side surface portion 131a and the third side surface portion 131c and having a slit shape extending in a direction (-x direction) away from the side surface 100a of the substrate 100, and the second recess portion RS2 being between the second side surface portion 131b and the third side surface portion 131c and having a slit shape extending in the direction (-x direction) away from the side surface of the substrate 100. In this case, the first and second recesses RS1 and RS2 may be parallel to each other.

A third pad PD3 (see, e.g., FIG. 10) below the second pad PD2, and a second insulating layer 122 between the third pad PD3 and the second pad PD2 may be further included in the embodiments described with reference to FIGS. 11 through 14.

As described above, according to one or more embodiments, a display device with a reduced area of a dead space and a low defect occurrence rate may be implemented. The scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate including a display area and a peripheral area adjacent to the display area;
a first insulating layer disposed over the peripheral area of the substrate and including:
a plurality of through holes extending in a direction perpendicular to the substrate;
a first side surface portion including a side surface aligned with a side surface of the substrate;
a second side surface portion spaced apart from the first side surface portion and including a side surface aligned with the side surface of the substrate; and
at least one recess portion between the first side surface portion and the second side surface portion, each of the at least one recess portion having a shape of a part of a through hole extending in the direction perpendicular to the substrate, each of the at least one recess portion having a volume smaller than a volume of one of the plurality of through holes; and
a first pad disposed on the first insulating layer, extending to an edge of the substrate, and completely filling the at least one recess portion, the first pad including an outermost front end surface that faces away from the display area and is aligned with the side surface of the substrate.

2. The display device of claim 1, wherein
the first pad completely fills each of the plurality of through holes,
each through hole is spaced apart from a contact area of the first pad as seen from plan view, and
the first pad makes direct contact with a top surface of a common conductive layer below the first insulting layer in each through hole.

3. The display device of claim 2, wherein the plurality of through holes are arranged randomly in a plan view with respect to the substrate.

4. The display device of claim 2, wherein
the first pad has a shape extending along a long axis of the first pad, and
the plurality of through holes are arranged in a zigzag pattern in a direction perpendicular to the long axis of the first pad with at least three through holes defining each straight line of the zigzag pattern.

5. The display device of claim 2, wherein the plurality of through holes are arranged such that a virtual straight line, which is parallel to an upper surface of the substrate and passes through the first pad, passes through at least one of the plurality of through holes.

6. The display device of claim 2, wherein the plurality of through holes are arranged such that a virtual plane, which is parallel to the side surface of the substrate, passes through at least one of the plurality of through holes.

7. The display device of claim 1, wherein
the first insulating layer comprises a third side surface portion between the first side surface portion and the second side surface portion, the third side surface portion including a side surface aligned with the side surface of the substrate, and
the at least one recess portion comprises:
a first recess portion between the first side surface portion and the third side surface portion, and
a second recess portion between the second side surface portion and the third side surface portion.

8. The display device of claim 1, comprising a second pad disposed between the substrate and the first pad, contacting the first pad, and including an outermost front end surface aligned with the side surface of the substrate.

9. The display device of claim 8, wherein the first insulating layer is disposed between the first pad and the second pad and covering side edges of the second pad connected to the outermost front end surface of the second pad.

10. The display device of claim 8, further comprising:
a third pad disposed below the second pad; and
a second insulating layer disposed between the third pad and the second pad.

11. The display device of claim 1, wherein at a center of at least one recess portion at the edge of the substrate, a top surface of the first pad makes direct contact with an insulator.

12. The display device of claim 1, wherein at the edge of the substrate, a top surface of the first pad is flat across an entirety of at least one recess portion.

13. A display device comprising:
a substrate including a display area and a peripheral area adjacent to the display area;
a first insulating layer disposed over the peripheral area of the substrate, including a plurality of through holes extending in a direction perpendicular to the substrate, and including at least one recess portion in a side surface of the first insulating layer, wherein a portion of the side surface of the first insulating layer other than another portion of the side surface where the at least one recess portion is disposed is aligned with the side surface of the substrate, each of the at least one recess portion having a shape of a part of a through hole extending in the direction perpendicular to the substrate, and each of the at least one recess portion has a volume smaller than a volume of one of the plurality of through holes; and a first pad disposed on the first insulating layer, extending to an edge of the substrate, and completely filling the at least one recess portion, the first pad including an outermost front end surface that faces away from the display area and is aligned with the side surface of the substrate.

14. The display device of claim 13, wherein
the first pad completely fills at least one of the plurality of through holes.

15. The display device of claim 14, wherein the plurality of through holes are arranged randomly in a plan view with respect to the substrate.

16. The display device of claim 14, wherein
the first pad has a shape extending along a long axis of the first pad, and
the plurality of through holes are arranged in a zigzag pattern in a direction perpendicular to the long axis of the first pad with at least three through holes defining each straight line of the zigzag pattern.

17. The display device of claim 14, wherein the plurality of through holes are arranged such that a virtual straight line, which is parallel to an upper surface of the substrate and passes through the first pad, passes through at least one of the plurality of through holes.

18. The display device of claim 14, wherein the plurality of through holes are arranged such that a virtual plane, which is parallel to the side surface of the substrate, passes through at least one of the plurality of through holes.

19. The display device of claim 13, comprising a second pad disposed between the substrate and the first pad, contacting the first pad, and including an outermost front end surface aligned with the side surface of the substrate.

20. The display device of claim 19, wherein the first insulating layer is disposed between the first pad and the second pad and covering side edges of the second pad connected to the outermost front end surface of the second pad.

21. The display device of claim 19, comprising:
a third pad disposed below the second pad; and
a second insulating layer disposed between the third pad and the second pad.

22. A display device comprising:
a substrate including a display area and a peripheral area adjacent to the display area;
a first insulating layer disposed over the peripheral area of the substrate and including:
  a first side surface portion including a side surface aligned with a side surface of the substrate;
  a second side surface portion spaced apart from the first side surface portion and including a side surface aligned with the side surface of the substrate;
  a plurality of through holes extending in a direction perpendicular to the substrate; and
  at least one recess portion between the first side surface portion and the second side surface portion, each of the at least one recess portion having a shape of a part of a through hole extending in the direction perpendicular to the substrate, each of the at least one recess portion having a volume smaller than a volume of one of the plurality of through holes;
a plurality of first pads disposed on the first insulating layer and spaced apart from each other, the plurality of first pads completely filling the at least one recess portion and completely filling at least a part of the plurality of through holes; and
a second pad disposed between the substrate and the plurality of first pads, contacting the plurality of first pads, and including an outermost front end surface aligned with the side surface of the substrate, wherein
at least a part of the plurality of first pads includes an outermost front end surface aligned with the side surface of the substrate.

23. The display device of claim 22, wherein the plurality of through holes are arranged randomly in a plan view with respect to the substrate.

24. The display device of claim 22, wherein
the second pad has a shape extending along a long axis of the second pad, and
the plurality of through holes are arranged in a zigzag pattern in a direction perpendicular to the long axis of the second pad with at least three through holes defining each straight line of the zigzag pattern.

25. The display device of claim 22, wherein the plurality of through holes are arranged such that a virtual straight line, which is perpendicular to a side surface of a longest direction of the first pad passes through as least two through holes.

26. The display device of claim 22, wherein the plurality of through holes are arranged such that a virtual plane, which is parallel to the side surface of the substrate, passes through at least one of the plurality of through holes.

27. The display device of claim 22, wherein the first insulating layer covers side edges of the second pad connected to the outermost front end surface of the second pad.

28. The display device of claim 22, further comprising:
a third pad disposed below the second pad; and
a second insulating layer disposed between the third pad and the second pad.

* * * * *